(12) United States Patent
Hwang

(10) Patent No.: US 8,039,939 B2
(45) Date of Patent: Oct. 18, 2011

(54) EMBEDDED WIRING BOARD, SEMICONDUCTOR PACKAGE INCLUDING THE SAME AND METHOD OF FABRICATING THE SAME

(75) Inventor: Taejoo Hwang, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 100 days.

(21) Appl. No.: 12/495,448

(22) Filed: Jun. 30, 2009

(65) Prior Publication Data
US 2009/0321921 A1    Dec. 31, 2009

(30) Foreign Application Priority Data
Jun. 30, 2008   (KR) .................. 10-2008-0062708

(51) Int. Cl.
H01L 23/02   (2006.01)

(52) U.S. Cl. ........ 257/680; 257/686; 257/700; 257/701; 257/764; 257/E25.029

(58) Field of Classification Search .................. 257/680, 257/686, 700, 701, E25.029, 764
See application file for complete search history.

(56) References Cited

U.S. PATENT DOCUMENTS

| 2,890,395 A | 6/1959 | Lathrop et al. |
| 7,217,994 B2 * | 5/2007 | Zhu et al. ............ 257/686 |
| 2001/0028114 A1 * | 10/2001 | Hosomi ............... 257/778 |

FOREIGN PATENT DOCUMENTS

| JP | 03-283591 | 12/1991 |
| JP | 08-204056 | 8/1996 |
| JP | 09-321408 | 12/1997 |
| JP | 2002-246757 | 8/2002 |
| KR | 100685177 B1 | 2/2007 |
| KR | 1020070029930 A | 3/2007 |
| WO | WO 2004/077902 A1 | 9/2004 |
| WO | WO 2004/077903 A1 | 9/2004 |

* cited by examiner

*Primary Examiner* — Bradley K Smith
*Assistant Examiner* — Mohammad Karimy
(74) *Attorney, Agent, or Firm* — Myers Bigel Sibley & Sajovec, P.A.

(57) ABSTRACT

Provided are an embedded wiring board and a method of manufacturing the same. The embedded wiring board includes: a printed circuit board (PCB) including a first surface and a second surface, the first surface having a concave portion; through electrodes penetrating the PCB; a semiconductor device group embedded in the concave portion of the PCB, the semiconductor device group including bonding pads exposed in a direction of the first surface of the PCB; bumps disposed on the bonding pads, exposed in the direction of the first surface of the PCB; and a film substrate including a first surface and a second surface, the first surface including connection electrode patterns that are electrically connected to the bumps and the through electrodes, the film substrate having penetrated openings.

7 Claims, 9 Drawing Sheets

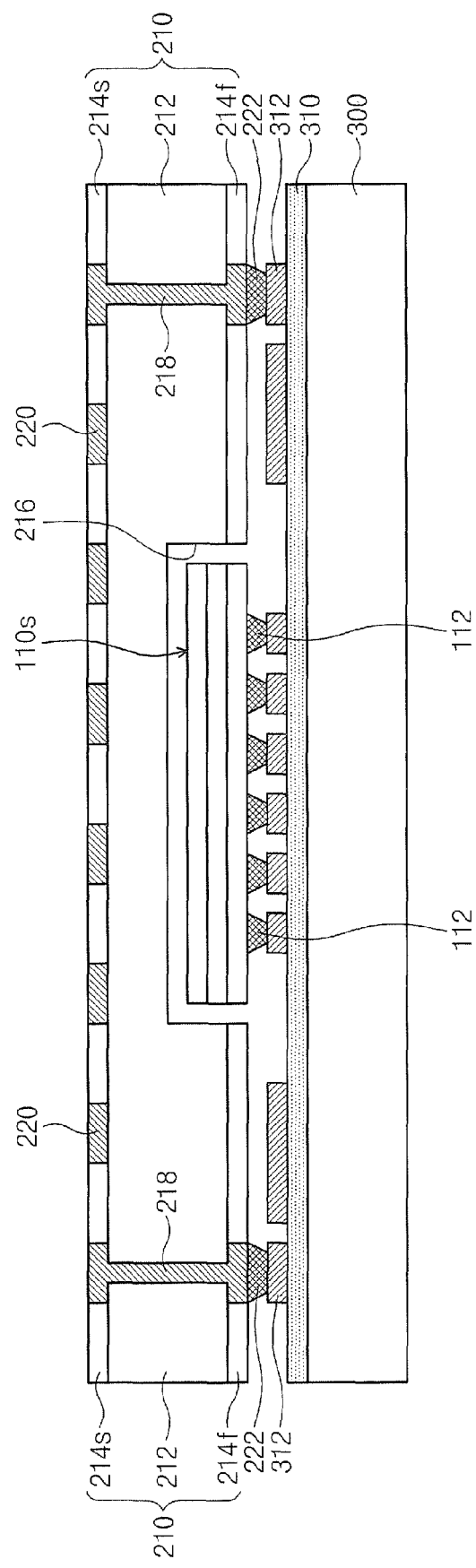

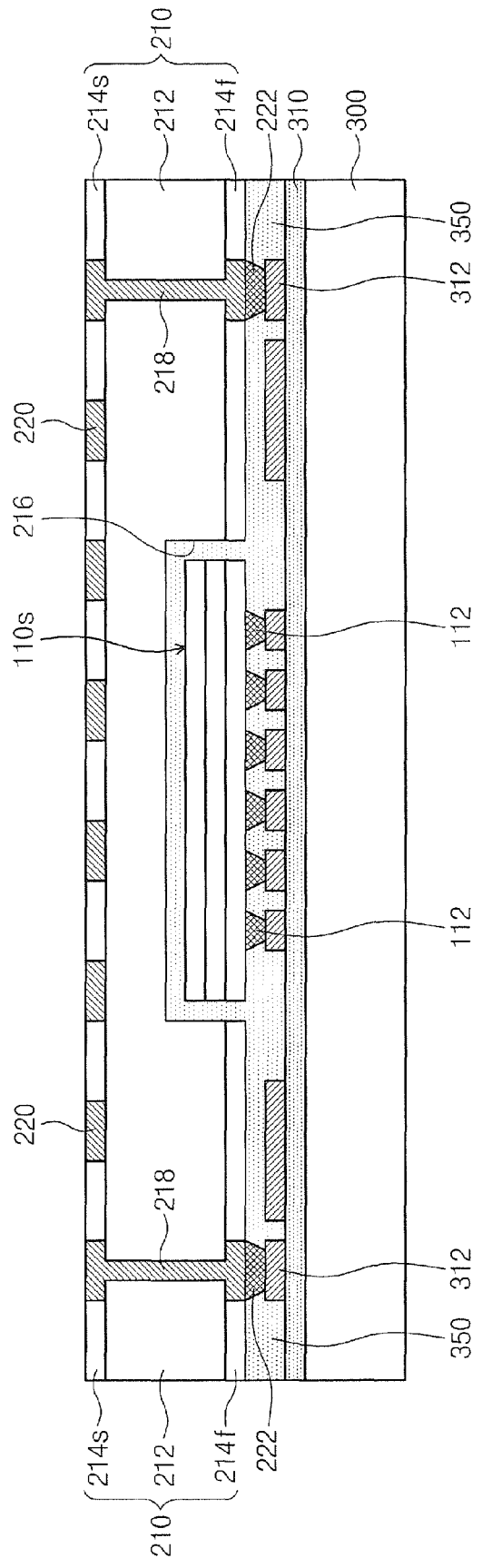

EMBEDDED WIRING BOARD, SEMICONDUCTOR PACKAGE INCLUDING THE SAME AND METHOD OF FABRICATING THE SAME

CROSS-REFERENCE TO RELATED APPLICATIONS

This application claims priority from Korean Patent Application No. 10-2008-0062708, filed on Jun. 30, 2008, the entire contents of which are hereby incorporated by reference.

SUMMARY

The inventive concept disclosed herein relates to a semiconductor package including an embedded wiring board and a method of fabricating the same.

A packaging technique for an integrated circuit has been continuously developed to satisfy a demand for device miniaturization in the semiconductor industry. Additionally, a multi-chip package for mounting a plurality of semiconductor chips in one package is under study. For the multi-chip package, a System In Package (SIP), which enables mounting a plurality of semiconductor chips performing respectively different functions in one package in order to realize a system, has been receiving an intense attention.

Moreover, to realize a high speed operation of the SIP, it is required that a non-memory device (e.g., a logic device) and a memory device be directly connected to each other. However, if the non-memory device and the memory device have respectively different pad positions or their designs are changed, it is impossible to connect them directly. Accordingly, a semiconductor package, where mutual connections are possible regardless of types and designs of a semiconductor device, is required. Therefore, applicable fields of an embedded technology can be increased.

One or more embodiments of the inventive concept provide a wiring board where easy arrangement, inexpensive cost, double-sided use, and semiconductor device stack are possible.

One or more embodiments of the inventive concept also provide a semiconductor package including a wiring board where easy arrangement, inexpensive cost, double-sided use, and semiconductor device stack are possible, and a method of fabricating the semiconductor package.

According to one or more embodiments, there is provided an embedded wiring board that may include: a printed circuit board (PCB) including a first surface and a second surface, the first surface having a concave portion recessed toward the first surface; through electrodes penetrating the PCB; a semiconductor device group embedded in the concave portion of the PCB, the semiconductor device group including bonding pads exposed in a direction of the first surface of the PCB; bumps disposed on the through electrodes and the bonding pads, exposed in the direction of the first surface of the PCB; and a film substrate including a first surface and a second surface, the first surface including connection electrode patterns that are electrically connected to the bumps, the film substrate having penetrated openings.

The film substrate may include a photo-sensitive dry film or a laser-punched polyimide film The embedded wiring boards may further include a molding layer provided between the PCB and the film substrate, the PCB including the semiconductor device group.

According to one or more embodiments, there is provided a semiconductor packages that may include: the embedded wiring board of the above; and other semiconductor device connected to the connection electrode patterns electrically through the openings of the film substrate.

The other semiconductor device may be a logic device.

The semiconductor packages may further include: connection electrodes provided on the second surface of the PCB; and connection terminals provided on the connection electrodes.

The semiconductor packages may further include a molding portion to cover the other semiconductor device and the second surface of the film substrate.

According to one or more embodiments, there is provided a method of fabricating a semiconductor package that may include: forming connection electrode patterns on a first surface of a film substrate; mounting a semiconductor device group through a flip chip method to be electrically connected to the connection electrode patterns; mounting a PCB to be electrically connected to the connection electrode patterns when the semiconductor device group is embedded; and forming openings in the second surface of the film substrate to expose the connection electrode patterns, wherein: the PCB includes a first surface and a second surface, the first surface having a concave portion for embedding the semiconductor device group, through electrodes penetrate the PCB, and the through electrodes exposed in a direction of the first surface of the PCB are electrically connected to the connection electrode patterns.

The semiconductor chip group and the PCB may be mounted by using bumps as a medium to be electrically connected to the connection electrode patterns.

The film substrate may include a photo-sensitive dry film or a laser-punched polyimide film.

The forming the connection electrode patterns may include: forming a conductive layer on the first surface of the film substrate; and patterning the conductive layer.

The forming the conductive layer may be performed through an electroless plating method.

The above method may further include forming a molding layer between the PCB and the film substrate, the PCB including the semiconductor device group.

The forming the openings may be performed through a photolithography or a laser punching method.

The above method may further include mounting other semiconductor device to be electrically connected to the connection electrode patterns through the openings of the film substrate.

The other semiconductor device may be a logic device.

The PCB may further include connection electrodes on the second surface of the PCB; and the methods may further include forming connection terminals on the connection electrodes.

The above method may further include forming a molding portion to cover the other semiconductor device and the second surface of the film substrate.

BRIEF DESCRIPTION OF THE DRAWINGS

The drawings illustrate non-limiting and non-exhaustive exemplary embodiments and, together with the description, serve to explain principles of the exemplary embodiments. In the figures:

FIGS. 3A through 3F are cross-sectional views illustrating a method of fabricating an embedded wiring board according to an exemplary embodiment.

DETAILED DESCRIPTION OF EXEMPLARY EMBODIMENTS

Figure 1:
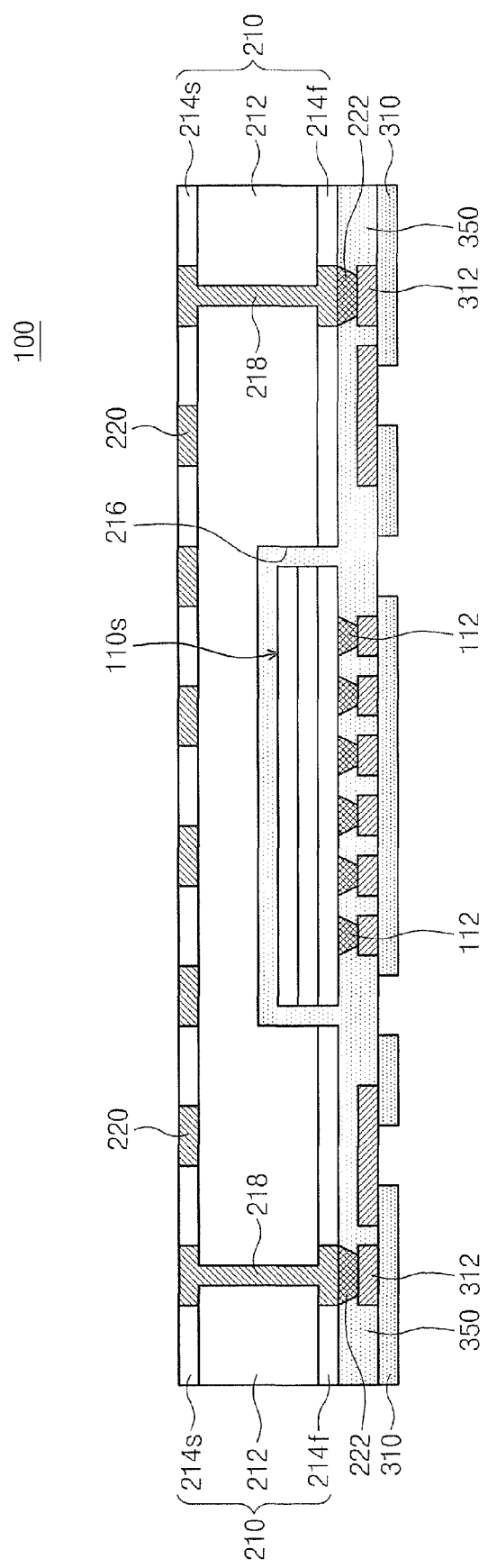
FIG. 1 is a cross-sectional view illustrating an embedded wiring board according to an exemplary embodiment.

Exemplary embodiments will be described below in more detail with reference to the accompanying drawings. The inventive concept may, however, be embodied in different forms and should not be construed as limited to the exemplary embodiments set forth herein. Rather, these exemplary embodiments are provided so that this disclosure will be thorough and complete, and will fully convey the scope of the inventive concept to those skilled in the art. In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

FIG. 1 is a cross-sectional view illustrating an embedded wiring board according to an exemplary embodiment.

Referring to FIG. 1, an embedded wiring board 100 may include a printed circuit board (PCB) 210, a semiconductor device group 110s, semiconductor device bumps 112, PCB bumps 222, a film substrate 310, and a molding layer 350.

The PCB 210 may include a first surface and a second surface. The first surface may have a recess portion 216 recessed toward the first surface. Here, the first surface and the second surface of the PCB 210 may be a rear surface and a front surface of the PCB 210. The recess portion 216 may be a concave portion or a cavity. The PCB 210 may include a first surface insulation layer pattern 214f disposed over the first surface, and a second surface insulation layer pattern 214s disposed over the second surface. The PCB 210 may use a core part 212 including an inner wiring (not shown) as a body. The first surface insulation layer pattern 214f may be disposed on the first surface of the PCB 210 except for the recess portion 216. The second surface insulation layer pattern 214s may include connection electrodes 220 on the second surface. Through electrodes 218 may penetrate the PCB 210 to electrically connect the first surface and the second surface of the PCB 210. The through electrodes 218 may have surfaces exposed in directions of the first and second surfaces of the PCB 210. The direction of the first surface may be perpendicular to the first surface and may be toward the outside of the PCB 210. The direction of the second surface may be perpendicular to the second surface and may be toward the outside of the PCB 210. The direction of the first surface may be opposite to the direction of the second surface.

The recess portion 216 at the first surface of the PCB 210 may be provided for disposing the semiconductor device group 110s in the recess portion 216. The semiconductor device group 110s may be enclosed or embedded in the recess portion 216 according to another exemplary embodiment. A surface level of the semiconductor device group 110s may be equal or lower than the first surface of the PCB 210. Preferably, the surface of the semiconductor device group 110s and the first surface of the PCB 210 may be a substantially same level. The surfaces of the through electrodes 218 exposed in the direction of the first surface of the PCB 210 may be electrically connected to connection electrode patterns 312 formed on a first surface of the film substrate 310 by using the PCB bumps 222 as a medium. On the other hand, the surfaces of the through electrodes 218 exposed in the direction of the second surface of the PCB 210 may be electrically connected to connection electrode patterns 312 formed on a first surface of the film substrate 310 by using a bonding wires (not shown) as a medium. The connection electrodes 220 in the second surface of the PCB 210 may provide an electrical connection between the PCB 210 and an external circuit such as a system board (not shown) by using the connection terminals 230 of FIG. 2 such as solder balls as a medium. Here, the first surface of the film substrate 310 may be a front surface of the film substrate 310 facing toward the first surface of the PCB 210, and the second surface of the film substrate 310 may be a rear surface of the film substrate 310.

The semiconductor device group 110s may be disposed in the recess portion 216 provided at the first surface of the PCB 210. If the recess portion 216 and the semiconductor device group 110s have corresponding shapes, the semiconductor device group 110s may be embedded into the recess portion 216 by using an adhesive material layer (not shown) as a medium. The semiconductor device group 110s may include a semiconductor device that has bonding pads (not shown) exposed in the direction of the first surface of the PCB 210. The semiconductor device group 110s may include the same or different device in size and function. The semiconductor device group 110s may include logic devices such as central processing unit (CPU), digital signal processor (DSP), controller, processor and the like, passive devices such as capacitor, inductor, resistor, filter, diode and the like, active devices such as operational amplifier (OP-AMP), transistor, switch, multiplexer (MUX) and the like, and memory devices such as dynamic random access memory (DRAM), static random access memory (SRAM), flash memory, magnetic random access memory (MRAM), phase-change random access memory (PRAM), resistive random access memory (ReRAM), spin transfer torque random access memory (STT-RAM), uni-transistor random access memory (UtRAM) and the like. Preferably, the semiconductor device group 110s may include at least one memory chip. The semiconductor device group 110s may also include a non-memory chip. The bonding pads of the semiconductor device exposed in the direction of the first surface of the PCB 210 may be electrically connected to the connection electrode patterns 312 formed on the first surface of the film substrate 310 by using the semiconductor device bumps 112 as a medium.

When the semiconductor device group 110s includes a plurality of memory chips, the memory chips may be electrically connected to one another via through electrodes (not shown) penetrating the memory chips and thus may be electrically connected to the connection electrode patterns 312 formed on the first surface of the film substrate 310. Or, upper memory chips except for the lowest memory chip among the memory chips of the semiconductor device group 110s may be electrically connected to the connection electrode patterns 312 on the first surface of the film substrate 310 through a wire bonding method (not shown). Furthermore, lower memory chips among the memory chips of the semiconductor device group 110s may be electrically connected to one another via through electrodes (not shown), and thus the upper memory chips may be electrically connected to the connection electrode patterns 312 on the first surface of the film substrate 310 through the wire bonding method.

The semiconductor device bumps 112 and the PCB bumps 222 may be respectively provided on the bonding pads and the through electrodes 218, exposed in the direction of the first surface of the PCB 210. Accordingly, the semiconductor device group 110s may be connected to the first surface of the film substrate 310 in a flip chip form by using the semiconductor device bumps 112 as a medium. Additionally, the through electrodes 218 of the PCB 210 may be electrically connected to the connection electrode patterns 312 provided on the first surface of the film substrate 310 by using the PCB bumps 222 as a medium.

The film substrate 310 may include the first surface and a second surface. The first surface may include the connection electrode patterns 312 that are electrically connected to the semiconductor device bumps 112 and the PCB bumps 222. The film substrate 310 may have openings through which other semiconductor device may be electrically connected to the connection electrode patterns 312 provided on the film substrate 310. The film substrate 310 may include at least one of a photo-sensitive dry film and a laser-punched polyimide film.

The molding layer 350 may be provided between the PCB 210 including the semiconductor device group 110s and the film substrate 310. The molding layer 350 may be formed of Epoxy Molding Compound (EMC). If the size of the semiconductor device group 110s is smaller than that of the recess portion 216 provided at the first surface of the PCB 210, the molding layer 350 may fill a gap between the semiconductor device group 110s and the recess portion 216 of the PCB 210 such that the semiconductor device group 110s may be embedded in the PCB 210. Accordingly, the molding layer 350 can protect the semiconductor device group 110s from the chemical/physical external environments, and also can improve electrical/physical reliability of the embedded wiring board 100.

Since the embedded wiring board 100 mounts the semiconductor device group 110s and the PCB 210 on the connection electrode patterns 312 above the previously formed film substrate 310 through a flip chip method, alignment may be completed without difficulties during a manufacturing process. Moreover, there is a little limitation for a pitch between bonding pads of the semiconductor device group 110s and there is no burden for a margin because no process for forming an additional redistribution is required. Furthermore, stacking of semiconductor devices can be realized.

Figure 2:
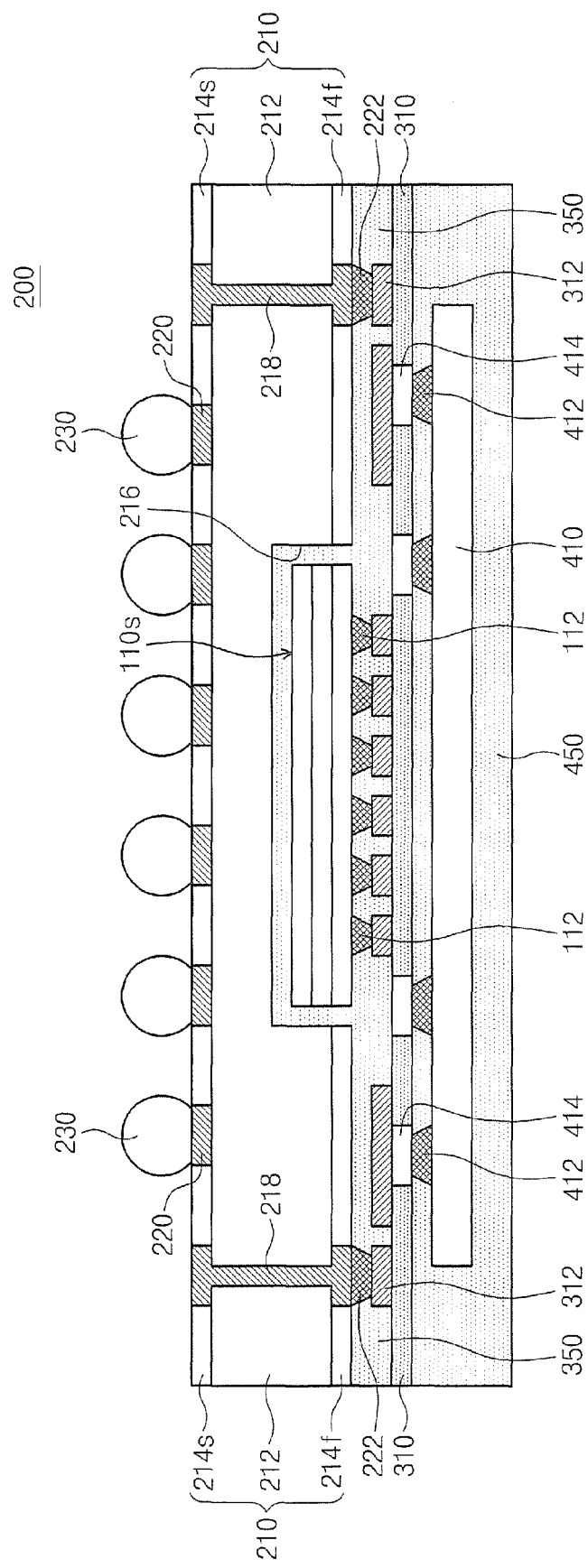
FIG. 2 is a cross-sectional view illustrating a semiconductor package according to an exemplary embodiment.

FIG. 2 is a cross-sectional view illustrating a semiconductor package according to an exemplary embodiment. For a concise description, overlapping descriptions related to FIG. 1 in FIG. 2 will be omitted.

Referring to FIG. 2, a semiconductor package 200 may include the embedded wiring board 100 of FIG. 1, other semiconductor device 410, a molding portion 450, and connection terminals 230.

The other semiconductor device 410 may include logic devices such as central processing unit (CPU), digital signal processor (DSP), controller, processor and the like, passive devices such as capacitor, inductor, resistor, filter, diode and the like, active devices such as operational amplifier (OP-AMP), transistor, switch, multiplexer (MUX) and the like, and memory devices such as dynamic random access memory (DRAM), static random access memory (SRAM), flash memory, magnetic random access memory (MRAM), phase-change random access memory (PRAM), resistive random access memory (ReRAM), spin transfer torque random access memory (STT-RAM), uni-transistor random access memory (UtRAM) and the like. Preferably, the other semiconductor device 410 may be a memory device or a non-memory device such as a logic device. The other semiconductor device 410 may be connected to the second surface of the film substrate 310 in a flip chip form by using bumps 412 formed on the bonding pads (not shown) and bonding electrodes 414 provided on the bumps 412 as a medium. For example, the semiconductor package 200 according to an exemplary embodiment may include a controller and a mobile DRAM as the semiconductor device group 110s, and a flash memory as the other semiconductor device 410.

If the bumps 412 such as solder balls are formed on the bonding pads of the other semiconductor device 410, the bonding electrodes 414 may be omitted. This is because the bumps 412 of the solder ball form may fill openings of the film substrate 310 and may be electrically connected to the connection electrode patterns 312 provided on the first surface of the film substrate 310 during a reflow process for mounting the other semiconductor device 410 on the second surface of the film substrate 310.

The molding portion 450 may be provided to cover the other semiconductor device 410 and the second surface of the film substrate 310. The molding portion 450 may be formed of EMC that is used for the molding layer 350. Accordingly, the molding portion 450 can protect the other semiconductor device 410 from chemical/physical external environments, and can improve electrically/physical reliability.

The connection terminals 230 may be provided on the connection electrodes 220 in the second surface of the PCB 210. The connection terminals 230 may provide an electrical connection between an external circuit such as a system substrate (not shown) and the semiconductor package 200.

Since the semiconductor package 200 includes the embedded wiring board 100 of FIG. 1 for mounting the semiconductor device group 110s and the PCB 210 on the connection electrode patterns 312 provided above the previously formed film substrate 310 through a flip chip method, alignment may be completed without difficulties during a manufacturing process. Moreover, there is a little limitation for a pitch between bonding pads of the semiconductor device group 110s and there is no burden for a margin because no process for forming an additional redistribution is required. Furthermore, stacking of semiconductor devices can be realized. As a result, a semiconductor package, where mutual connection is possible regardless of types or designs of semiconductor devices and methods of fabricating the semiconductor package, can be provided.

FIGS. 3A through 3F are cross-sectional views illustrating a method of fabricating the embedded wiring board according to an exemplary embodiment.

Figure 3A:
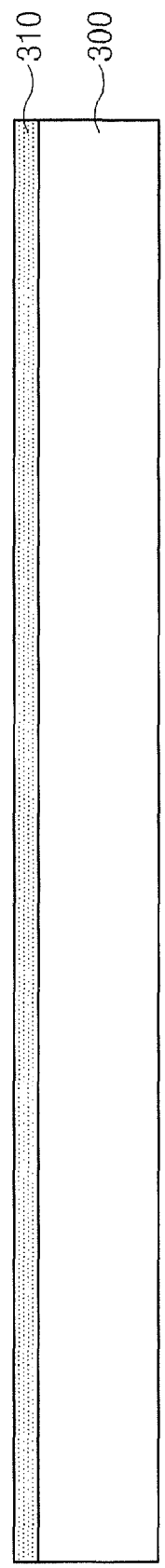
Figure 3B:
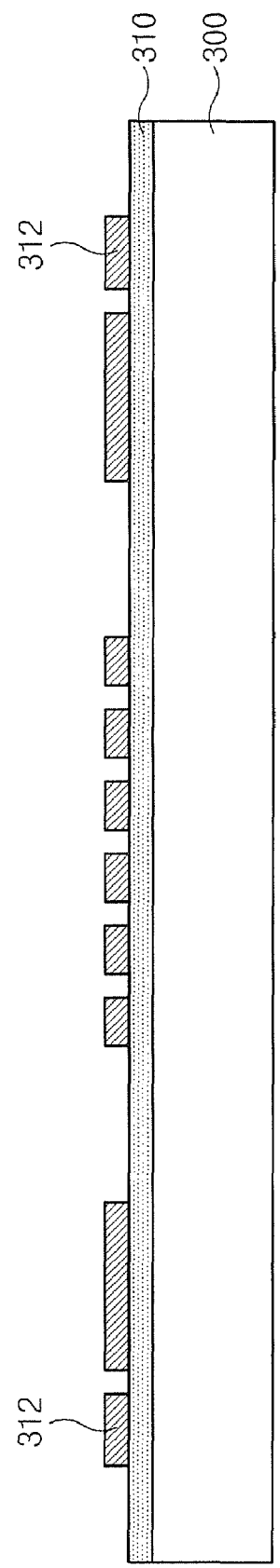
Figure 4A:
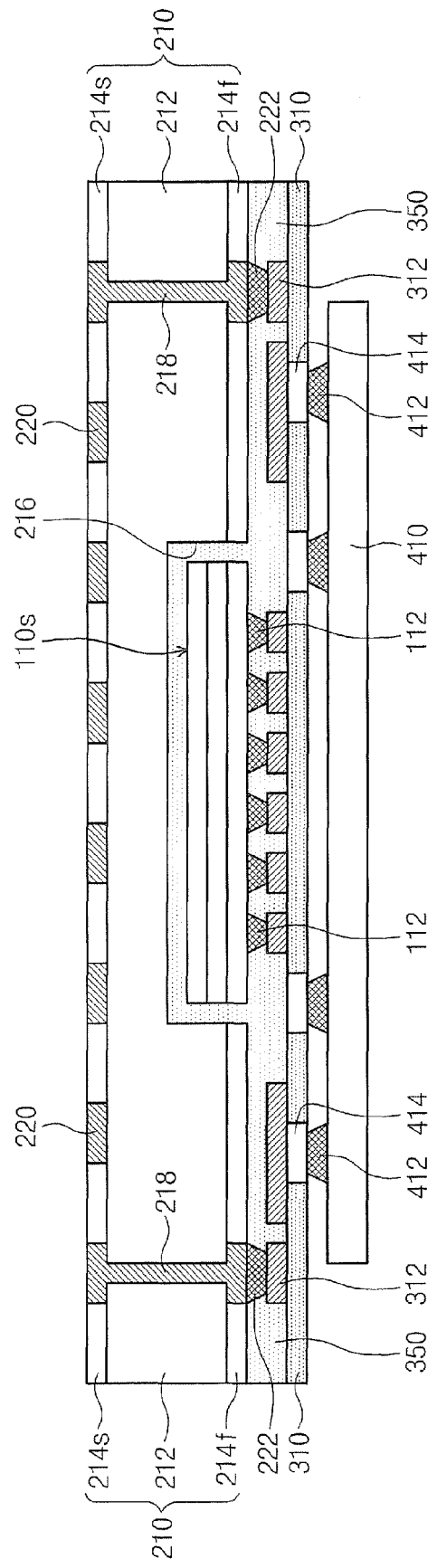
FIGS. 4A and 4B are cross-sectional views illustrating a method of fabricating a semiconductor package according to an exemplary embodiment.

Referring to FIGS. 3A and 3B, the film substrate 310 may be formed on a support substrate 300. A glass and/or a silicon may be used to form the support substrate 300. The support substrate 300 may be used for alleviating mechanical stress applied to the film substrate 310 during a process for fabricating the embedded wiring board. The film substrate 310 may include at least one of a photo-sensitive dry film and a laser-punched polyimide film. This allows openings to be easily formed. The openings may be formed on the film substrate 310 in order to mount other semiconductor chip 410 as shown in FIG. 4A during a subsequent process.

The forming of the film substrate 310 on the support substrate 300 may be completed by attaching a second surface of the film substrate 310 to the support substrate 300 through an adhesive material layer (not shown). The adhesive material layer may include a reworkable adhesive for simple separation after attachment. This is because the support substrate 310 is removed after the embedded wiring board is manufactured. The adhesive material layer may be formed of an adhesive including at least one of an ultraviolet (UV) curable resin and a thermoplastic resin.

Connection electrode patterns 312 may be formed on a first surface of the film substrate 310. The forming of the connection electrode patterns 312 may include patterning a conductive layer after forming the conductive layer on the first surface of the film substrate 310. The conductive layer may be a thin metal layer. The conductive layer may be a thin copper layer. The forming of the conductive layer may be performed through an electroless plating method.

Figure 3C:
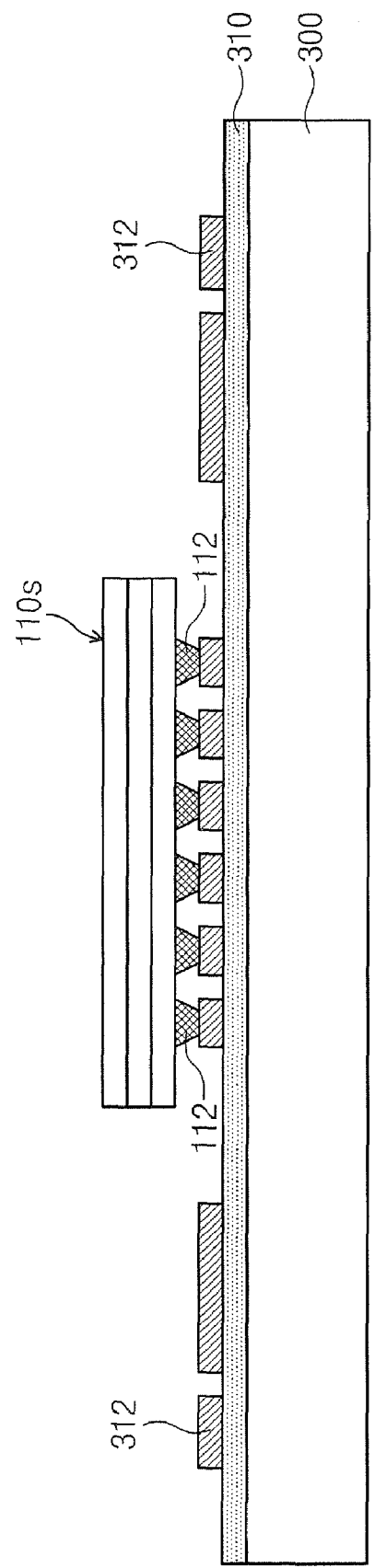

Referring to FIG. 3C, a semiconductor device group 110s may be mounted through a flip chip method to be electrically connected to the connection electrode patterns 312 formed on the first surface of the film substrate 310. The semiconductor device group 110s may include a semiconductor device having bonding pads (not shown) exposed in a direction of the first surface of the film substrate 310. The semiconductor device group 110s may include the same or different device in size and function. The semiconductor device group 110s may include at least one memory chip. The bonding pads of the semiconductor device exposed in the direction of the first surface of the film substrate 310 may be electrically connected to the connection electrode patterns 312 on the first surface of the film substrate 310 by using the semiconductor device bumps 112 provided as a medium.

When the semiconductor device group 110s includes a plurality of memory chips, the memory chips may be electrically connected to one another via through electrodes (now shown) penetrating the memory chips and thus may be electrically connected to the connection electrode patterns 312 formed on the first surface of the film substrate 310. Or, upper memory chips except for the lowest memory chip among the memory chips of the semiconductor device group 110s may be electrically connected to the connection electrode patterns 312 on the first surface of the film substrate 310 through a wire bonding method (not shown). Furthermore, lower memory chips among the memory chips of the semiconductor device group 110s may be electrically connected to one another via through electrodes (not shown), and thus the upper memory chips may be electrically connected to the connection electrode patterns 312 formed on the first surface of the film substrate 310 through the wire bonding method.

Referring to FIG. 3D, a PCB 210 may be mounted to be electrically connected to the connection electrode patterns 312 formed on the first surface of the film substrate 310. The PCB 210 may include a first surface and a second surface. The first surface may have a recess portion 216 recessed toward the second surface. Here, the first surface and the second surface of the PCB 210 may be a rear surface and a front surface of the PCB 210. The recess portion 216 may be a concave portion or a cavity. Through electrodes 218 penetrate the PCB 210 to electrically connect the first surface and the second surface of the PCB 210. The surfaces of the through electrodes 218 exposed in a direction of the first surface of the PCB 210 may be electrically connected to the connection electrode patterns 312 provided on the first surface of the film substrate 310 by using PCB bumps 222 as a medium. On the other hand, the surfaces of the through electrodes 218 exposed in the direction of the second surface of the PCB 210 may be electrically connected to connection electrode patterns 312 formed on a first surface of the film substrate 310 by using a bonding wires (not shown) as a medium. Accordingly, the semiconductor device group 110s can be dispose in the PCB 210 through the recess portion 216 provided at the first surface of the PCB 210, and the PCB 210 may be electrically connected to the connection electrode patterns 312 on the first surface of the film substrate 310. A surface level of the semiconductor device group 110s may be equal or lower than the first surface of the PCB 210. Preferably, the surface of the semiconductor device group 110s and the first surface of the PCB 210 may be a substantially same level. If the recess portion 216 formed at the first surface of the PCB 210 and the semiconductor device group 110s have corresponding shapes, the semiconductor device group 110s can be embedded into the recess portion 216 by using an adhesive material layer as a medium (not shown).

The PCB 210 may include a first surface insulation layer pattern 214f and a second surface insulation layer pattern 214s. The PCB 210 may use the core part 212 including an inner wiring (not shown) as a body. The first surface insulation layer pattern 214f may be disposed on the first surface of the PCB 210 except for the recess portion 216. The second surface insulation layer pattern 214s may include connection electrodes 220 on the second surface of the PCB 210. The through electrodes 218 may electrically connect the first surface and the second surface of the PCB 210, and may be electrically connected to the connection electrode patterns 312 on the first surface of the film substrate 310 through the surfaces of the through electrodes 218 exposed in the direction of the first or second surface of the PCB 210. The connection electrodes 220 in the second surface of the PCB 210 may provide an electrical connection between the PCB 210 and an external circuit by using the connection terminals 230 of FIG. 4B such as solder balls as a medium.

Referring to FIG. 3E, a molding layer 350 may be formed between the PCB 210 including the semiconductor device group 110s and the film substrate 310. The molding layer 350 may be formed of epoxy molding compound (EMC). If the size of the semiconductor device group 110s is smaller than that of the recess portion 216 provided at the first surface of the PCB 210, the molding layer 350 may fill a gap between the semiconductor device group 110s and the recess portion 216 of the PCB 210 such that the semiconductor device groups 110s can be embedded into the PCB 210. Accordingly, the molding layer 350 can protect the semiconductor device group 110s from chemical/physical external environments, and also can improve electrical/physical reliability of the embedded wiring board.

Figure 3F:
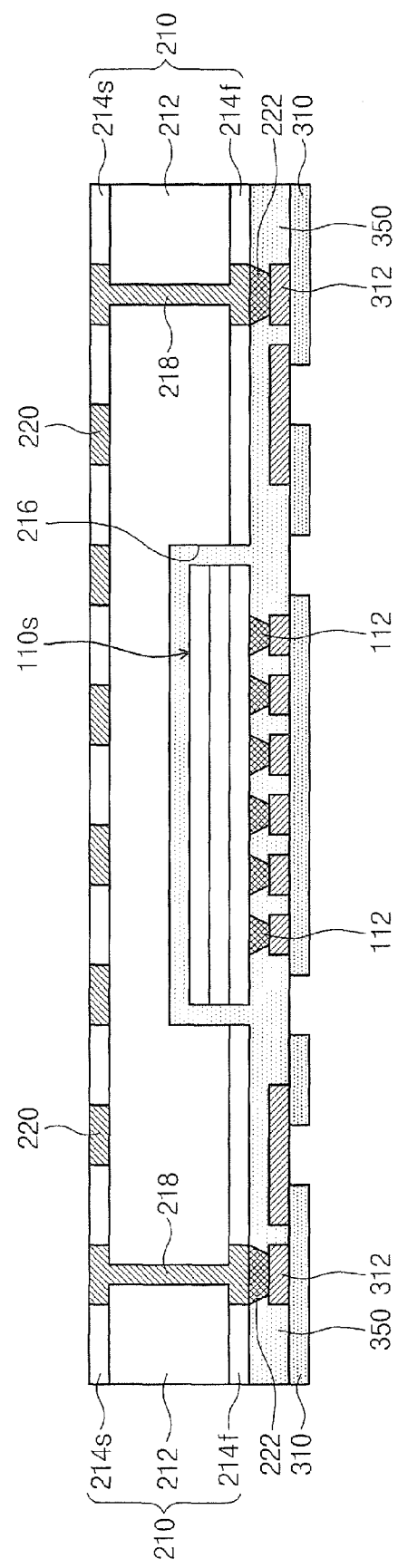

Referring to FIG. 3F, after removing the support substrate 300, openings may be formed in the second surface of the film substrate 310 to expose the connection electrode patterns 312. The openings may be used for mounting the other semiconductor device 410 of FIG. 4A during a process for fabricating a semiconductor package.

The forming of the openings in the second surface of the film substrate 310 to expose the connection electrode patterns 312 can be performed through at least one of a photolithography and a laser punching method. If the film substrate 310 is a photo-sensitive dry film, after removing the support substrate 300, the openings can be formed through a photolithography process. Unlike this, if the film substrate 310 is a laser-punched polyimide film, after or before removing the support substrate 300, the openings can be formed through a laser punching process.

Since the embedded wiring board fabricated using the above methods mounts the semiconductor device group 110s and the PCB 210 on the connection electrode patterns 312 provided above the previously formed film substrate 310 through a flip chip method, alignment may be completed without difficulties during a manufacturing process. Moreover, there is a little limitation for a pitch between bonding pads of the semiconductor device group 110s and there is no burden for a margin because no process for forming an additional redistribution is required. Furthermore, stacking of semiconductor chips can be realized.

Figure 4B:
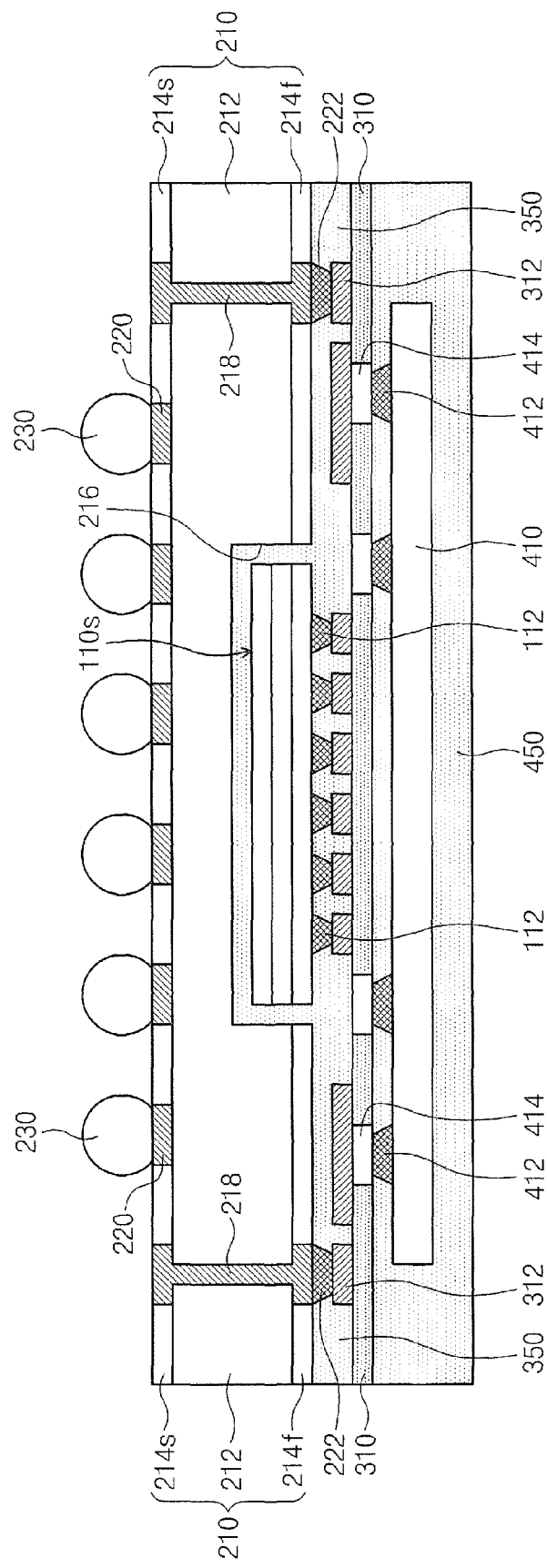

FIGS. 4A and 4B are cross-sectional views illustrating a method of fabricating a semiconductor package according to an exemplary embodiment. For a concise description, overlapping descriptions related to FIGS. 3A through 3F in FIGS. 4A and 4B will be omitted.

Referring to FIG. 4A, the embedded wiring board is prepared. Other semiconductor device 410 may be mounted to be electrically connected to the connection electrode patterns 312 on the first surface of the film substrate 310, through the openings of the film substrate 310. The other semiconductor chip 410 may be connected to the second surface of the film substrate 310 in a flip chip form by using bumps 412 on the bonding pads (not shown) and bonding electrodes 414 on the bumps 412 as a medium.

If the bumps 412 such as solder balls are formed on the bonding pads of the other semiconductor device 410, the bonding electrodes 414 may be omitted. This is because the bumps 412 of the solder ball form may fill the openings of the film substrate 310 and may be electrically connected to the connection electrode patterns 312 provided on the first surface of the film substrate 310 during a reflow process for mounting the other semiconductor device 410 on the second surface of the film substrate 310.

Referring to FIG. 4B, a molding portion 450 may be disposed to cover the other semiconductor chip 410 and the second surface of the film substrate 310. The molding portion 450 may be formed of EMC that is used for the molding layer 350. Accordingly, the molding portion 450 can protect the other semiconductor device 410 from chemical/physical external environments, and can improve electrically/physical reliability.

Connection terminals 230 may be formed on the connection electrode 220 in the second surface of the PCB 210. The connection terminals 230 may provide an electrical connection between the external circuit such as a system substrate (not shown) and the semiconductor package.

Since the semiconductor package according to the above methods mounts the semiconductor device group 110s and the PCB 210 on the connection electrode patterns 312 provided above the previously formed film substrate 310 through a flip chip method, alignment may be completed without difficulties during a manufacturing process. Moreover, there is a little limitation for a pitch between bonding pads of the semiconductor device group 110s and there is no burden for a margin because no process for forming an additional redistribution is required. Furthermore, stacking of semiconductor devices can be realized. As a result, a method of fabricating a semiconductor package, where mutual connection is possible regardless of types or designs of semiconductor devices, can be provided.

Since the embedded wiring board according to the above exemplary embodiments and the semiconductor package including the same mount the semiconductor device group 110s and the PCB 210 on the connection electrode patterns 312 provided above the previously formed film substrate 310 through a flip chip method, alignment may be completed without difficulties during a manufacturing process. Moreover, there is a little limitation for a pitch between bonding pads of the semiconductor device group 110s and there is no burden for a margin because no process for forming an additional redistribution is required. Furthermore, stacking of semiconductor devices can be realized. As a result, an embedded wiring board and a semiconductor package, where mutual connection is possible regardless of types or designs of semiconductor devices, can be provided.

The above-disclosed subject matter is to be considered illustrative, and not restrictive, and the appended claims are intended to cover all such modifications, enhancements, and other embodiments, which fall within the true spirit and scope of the present inventive concept. Thus, to the maximum extent allowed by law, the scope of the present inventive concept is to be determined by the broadest permissible interpretation of the following claims and their equivalents, and shall not be restricted or limited by the foregoing detailed description.

What is claimed is:

1. A semiconductor package comprising:
   a printed circuit board (PCB) including a first surface and a second surface, the first surface of the PCB including a recess portion recessed toward the second surface of the PCB, the recess portion including a recess bottom surface provided by the PCB;
   a through electrode penetrating the PCB;
   a semiconductor device disposed in the recess portion of the PCB, mounted to the recess bottom surface, the semiconductor device including a bonding pad exposed in a direction of the first surface of the PCB, wherein the semiconductor device is a first semiconductor device;
   a bump disposed on the bonding pad, exposed in the direction of the first surface of the PCB;
   a substrate including a first surface and a second surface, positioned opposite the recess portion, the first surface of the substrate including a connection electrode pattern that is electrically connected to the bump and the through electrode, the substrate having a penetrated opening;
   a second semiconductor device electrically connected to the connection electrode pattern through the opening of the substrate; and
   a molding portion to cover the second semiconductor device and the second surface of the substrate.

2. The semiconductor package of claim 1, wherein the substrate comprises at least one of a photo-sensitive dry film and a laser-punched polyimide film.

3. The semiconductor package of claim 1, further comprising a molding layer provided between the PCB and the substrate.

4. The semiconductor package of claim 1, wherein the semiconductor device is embedded in the recess portion of the PCB if the recess portion of the PCB and the semiconductor device have corresponding shapes.

5. The semiconductor package of claim 1, wherein the second semiconductor device comprises a logic device.

6. The semiconductor package of claim 1, wherein the first semiconductor device comprises a memory device or a non-memory device, and the second semiconductor device comprises a memory device or a non-memory device.

7. The semiconductor package of claim 1, further comprising:
   a connection electrode provided on the second surface of the PCB; and
   a connection terminal provided on the connection electrode.

* * * * *